United States Patent [19]

Menon et al.

[11] Patent Number: 4,884,042
[45] Date of Patent: Nov. 28, 1989

[54] DUAL PORT VOLTAGE CONTROLLED EMITTER COUPLED MULTIVIBRATOR

[75] Inventors: Suresh Menon; Enjeti Murthi, both of Sunnyvale, Calif.

[73] Assignee: National Semiconductor Corporation, Santa Clara, Calif.

[21] Appl. No.: 311,493

[22] Filed: Feb. 15, 1989

[51] Int. Cl.[4] .......................................... H03K 3/282
[52] U.S. Cl. ........................... 331/113 R; 331/177 R; 331/176
[58] Field of Search ............... 331/113 R, 144, 177 R, 331/176

[56] References Cited

U.S. PATENT DOCUMENTS

| | | | |
|---|---|---|---|
| 3,857,110 | 12/1974 | Grebene | 331/113 R X |
| 4,001,603 | 1/1977 | Wilcox | 331/1 A X |
| 4,468,636 | 8/1984 | Monticelli | 331/113 R |
| 4,692,718 | 9/1987 | Roza et al. | 331/113 R |

*Primary Examiner*—Siegfried H. Grimm

*Attorney, Agent, or Firm*—Gail W. Woodward; Lee Patch

[57] ABSTRACT

A voltage controlled oscillator includes an emitter coupled multivibrator in which a capacitor determines the frequency of oscillation along with a pair of load resistors and a pair of current sources. A differential amplifier is coupled to operate in parallel with the mutlivibrator and its tail current is operated differentially, with respect to the currents in the pair of sources, in response to the input voltage at a first modulation input port. Thus, a constant current flows in the multivibrator loads even when the frequency is modulated. A second input port is coupled to vary the tail current in the differential amplifier to comprise a dual port control of the voltage controlled oscillator. The circuit can be operated at a relatively low supply voltage and can be temperature compensated. Furthermore, the input ports can include circuitry having a logarithmic response for digital signaling processing.

6 Claims, 2 Drawing Sheets

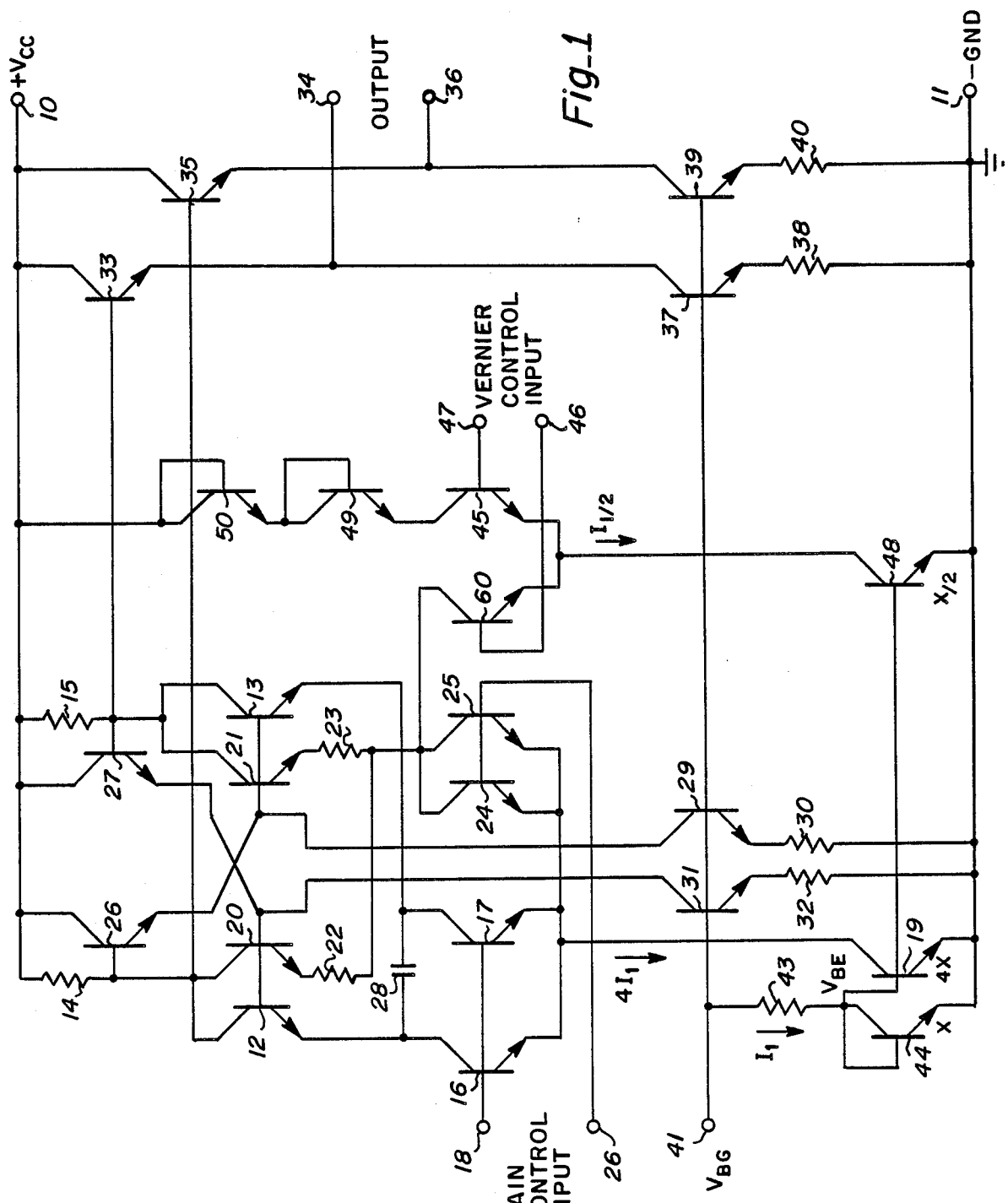

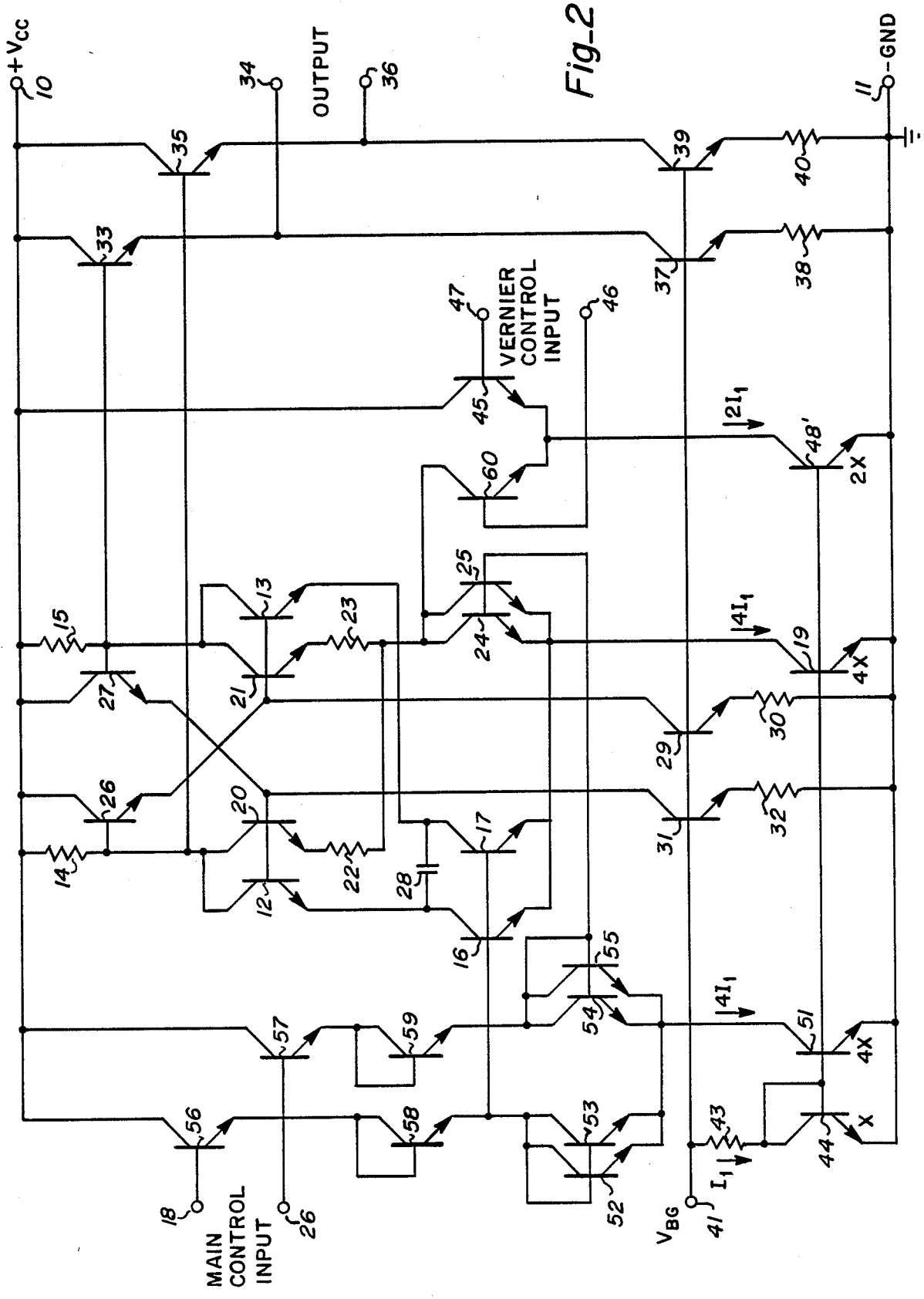

DUAL PORT VOLTAGE CONTROLLED EMITTER COUPLED MULTIVIBRATOR

BACKGROUND OF THE INVENTION

The invention relates to voltage controlled oscillator (VCO) circuits in which the frequency of oscillation is a function of an applied voltage. Such oscillators find use in phase locked loop (PLL) systems where an oscillator is forced to oscillate at a frequency and phase that is related to an input signal. For IC applications the oscillator of choice is typically the well-known emitter-coupled multivibrator. This circuit employs all NPN transistors and is thus capable of operating at relatively high frequencies. This basic circuit is the subject of U.S. Pat. No. 3,857,110. An improved version is disclosed in Monticelli patent 4,468,636, which is assigned to the assignee of the present invention. The teaching in these two patents is incorporated herein by reference.

One of the remaining problems associated with the prior art VCO's is their limitation of a single input control voltage for controlling the operating frequency and phase. We have discovered that where a system includes more than one PLL and the individual loops must be coupled together, the VCO can perform this function if it has plural inputs. Desirably, these inputs are isolated and can enjoy predetermined voltage-to-frequency sensitivity so that system performance can be predetermined.

SUMMARY OF THE INVENTION

It is an object of the invention to provide a VCO in which a constant current flows while being modulated.

It is another object of the invention to provide a VCO circuit which has more than one frequency-sensitive input voltage port.

It is still another object of the invention to employ a VCO circuit that has plural voltage inputs and a configuration in which oscillation frequency responds to a differential input voltage which partitions oscillator current between active and passive portions.

It is still another object of the invention to provide a plural input VCO which operates at a single +5 V supply and which can easily be temperature compensated.

It is still another object of the invention to configure the modulation input stage to provide a logarithmic digital signal processing function.

These and other objects are achieved in a circuit as follows. An emitter coupled multivibrator includes a capacitor that can be charged in two directions as a function of the currents in a pair of constant current elements which are operated as a function of an input voltage and coupled to the emitters of a pair of oscillator transistors. The multivibrator includes a parallel connected differential feedback stage which has its tail current operated differentially with respect to the constant current elements. The differential amplifier has its inputs and outputs connected in parallel with the oscillator transistors. A pair of emitter followers cross-couple the oscillator transistors conventionally to create a high gain multivibrator configuration. The output signal can be taken from the oscillator transistor collectors as a square wave. Alternatively, a sawtooth output can be taken from the emitters. The tail current of the differential feedback stage can be obtained from a second differentially controlled current supply and can be modulated by a second voltage input which also acts to vary the oscillator frequency. These two isolated voltage inputs can each be designed to provide the desired control sensitivity. As a general consideration, the constant current modulation elements in the oscillator transistor emitters provide the higher frequency-to-voltage sensitivity while the differential amplifier feedback current control provides a vernier frequency/phase control action. The voltage inputs can include circuitry that also provides a logarithmic digital signal processing function.

BRIEF DESCRIPTION OF THE DRAWING

FIG. 1 is a schematic diagram showing the circuit of the invention.

FIG. 2 is a schematic diagram of an alternative embodiment of the invention.

DESCRIPTION OF THE INVENTION

In the circuit of FIG. 1 a power supply is connected + to $V_{CC}$ terminal 10 and − to ground terminal 11. The heart of the circuit is oscillator transistors 12 and 13. Their collectors are returned to $+V_{CC}$ by way of matched load resistors 14 and 15 respectively. Their emitters are returned to ground by way of constant current transistors 16 and 17 which have their bases coupled together to control terminal 18. Transistors 16 and 17 have their emitters commonly connected to the collector of constant current supply transistor 19 and their collectors connected to a frequency determining capacitor 28.

Transistors 20 and 21 form a differential amplifier with degeneration resistors 22 and 23 in their respective emitters. Transistors 24 and 25 in parallel balance transistors 16 and 17 and act to provide the tail current flowing in transistors 20 and 21. Since the bases of transistors 24 and 25 are connected to input terminal 26 the tail current can be modulated by the differential input coupled between terminals 18 and 26. Since transistor 19 provides a constant current in the combination of transistors 16, 17, 24 and 25, the differential control terminals will act to direct the current flowing in transistor 19 to either oscillator transistors 12 and 13 or differential amplifier transistors 20 and 21.

The bases and collectors of transistors 20 and 21 parallel the equivalent elements of oscillator transistors 12 and 13 respectively. The collectors of transistors 12 and 20 directly drive emitter follower transistor 26 which in turn couples to the bases of transistors 13 and 21. Likewise, emitter follower transistor 27 couples the collectors of transistors 13 and 21 to the bases of transistors 12 and 20. This cross-coupling will render transistors 12 and 13 oscillatory, as is well-known in the art as taught in U.S. Pat. No. 3,857,110. Capacitor 28, which is connected between the emitters of transistors 12 and 13, will charge and discharge linearly which produces a sawtooth waveform thereacross. When transistors 16 and 17 have their currents modulated to vary the frequency of the VCO, the current changes are reflected in transistors 20 and 21. Thus, the total current flow is constant and oscillator gain is constant.

Transistor 29, with its emitter resistor 30, provides a constant current load for emitter follower transistor 26 and transistor 31, with its emitter resistor 32, provides a constant current load for emitter follower transistor 27. Emitter follower 33 couples the collectors of transistors 13 and 21 to output terminal 34 and emitter follower transistor 35 couples the collectors of transistors 12 and 20 to output terminal 36. Thus, the output at terminals 34 and 36 is a square wave. Constant current transistor 37 with its emitter resistor 38 acts as a load for transistor 33 and constant current transistor 39, with its emitter resistor 40 acts as a load for transistor 35. The bases of transistors 29, 31, 37 and 39 are operated at $V_{BG}$ above the ground potential by connecting a bandgap level voltage source (not shown) to bias terminal 41. This source is configured so that the potential at terminal 41 will decrease with temperature. It can be seen that as $V_{BG}$ falls with temperature, the $V_{BE}$ of each of the transistors will also fall, thus making the potentials across the associated emitter resistors substantially independent of temperature. This means that the currents in transistors 29, 31, 37 and 39 are substantially temperature independent and of a value determined by the emitter resistors.

Diode connected transistor 44 is returned to $V_{BG}$ terminal 41 by resistor 43. Thus $I_1$, which flows in resistor 43, is:

$$I_1 = (V_{BG} - V_{BE44})/R43$$

where R43 is the value of resistor 43.

Since both $V_{BG}$ and $V_{BE}$ fall with increasing temperature, their difference will cancel and the magnitude current $I_1$ will not only be determined by resistor 43, its temperature coefficient will be determined by the temperature coefficient of resistor 43. Transistor 19 is made to have four times the area of transistor 44 and is connected as a current mirror that will sink $4I_1$. Transistor 48, which has one-half of the area of transistor 44, is connected as a current mirror that will sink $I_1/2$.

As shown above, $I_1$ has a temperature coefficient that is determined by the temperature coefficient of resistance of resistor 43. This is selected to match that of resistors 14 and 15 in such a way that the frequency of the VCO will not vary significantly with temperature over the operating temperature range of $-55°$ C. to $125°$ C. Thus, while resistors 14 and 15 will vary with temperature and will act to change oscillator frequency, the temperature coefficient of resistor 43 will offset temperature drift.

Under quiescent conditions, when terminals 18 and 26 are shorted together, $I_1$ will flow in each of transistors 16, 17, 24 and 25. It has been determined that the free running oscillator frequency for the circuit of FIG. 1 is:

$$f_o \approx 1/17RC$$

where R is the value of resistors 14 and 15 and C is the value of capacitor 28.

This frequency varies very little over the range from $-55°$ C. to over $125°$ C. because of the temperature current characteristics of $I_1$ and the VCO bias currents as described above.

If terminal 18 is raised and terminal 26 is lowered differentially, conduction in transistors 16 and 17 will be increased while the currents flowing in transistors 24 and 25 will similarly be decreased. This will cause the charge cycle for capacitor 28 to speed up thereby producing an oscillator frequency increase. A lowering of the voltage at terminal 18, along with a rise at terminal 26, will lower frequency. The frequency-to-voltage relationship is linear and a relatively wide range control is available. It can be seen that as the current in oscillator transistors 12 and 13 is increased the current in differential amplifier transistor 20 and 21 will decrease a like amount. Thus, as the oscillator frequency is modulated or varied the currents flowing in resistors 14 and 15 will be constant and the output amplitude will remain constant.

Transistors 60 and 45 operate to provide a vernier frequency control input. They are connected differentially and their bases are respectively connected to input terminals 46 and 47 which comprise a second differential input port. The constant tail current for transistors 60 and 45 is provided by transistor 48 which has its base returned to the bases of transistor 19 and 60. Typically, transistor 48 is scaled to have one-half of the area of transistor 60 so that $I_1/2$ flows therein. The collector of transistor 60 is connected to the collectors of transistors 24 and 25 so that it will conduct a portion of the tail current flowing in differential transistors 20 and 21. The modulation is achieved by steering more or less current from common collectors of transistors 24 and 25 by changing the relative voltage at bases of transistors 60 and 45. The finite change in voltage is reflected, as described above for terminals 18 and 26, to appear across capacitor 28. Any such voltage change will result in a finite frequency change.

Diode connected transistors 49 and 50 return the collector of transistor 45 to $+V_{CC}$ and are present to balance the control action of transistors 60 and 45. It will be noted that since transistor 19 is returned to $-V_{EE}$, the emitters of transistors 16, 17, 24 and 25 can be lowered close to $V_{SAT}$ or a fraction of a volt. This maximizes the circuit common mode range and permits a low supply voltage. Typically, the circuit will operate with a five volt supply.

FIG. 2 is a schematic diagram of an alternative embodiment of the invention. Where the various parts perform as those of FIG. 1, the same designations are used. The bias network is virtually identical. The collector of transistor 45 is directly returned to $+V_{CC}$ rather than via diodes. This will have the effect of slightly reducing the accuracy of current steering, but will otherwise have little effect. A two times area transistor 48' provides $2I_1$ as tail current for transistors 60 and 45. This current distribution slightly increases the sensitivity of the vernier control input at terminals 46 and 47 over that of FIG. 1.

The main difference is how the main control input at terminals 18 and 26 is applied to the VCO. The input circuit provides level shifting, a high input impedance and a digital signal processing function. The input circuit operates as follows. The $I_1$ flowing in transistor 44 is mirrored in a four times area transistor 51 as $4I_1$. This current is caused to flow in transistors 52-55. Transistors 52 and 53 bias transistors 16 and 17 in the VCO while transistors 54 and 55 bias transistors 24 and 25. Input transistors 56 and 57 operate from the main control input terminals 18 and 26 as emitter followers. Transistor 56 drives transistors 52 and 53 by way of level shifting diode connected transistor 58. Transistor 57 drives transistors 54 and 55 through level shifting diode connected transistor 59. Thus, the differential input signal voltage at terminals 18 and 26 will frequency modulate the VCO as described in connection with FIG. 1. However, the input impedance of the main control input is high and will not appreciably load the input source.

If digital control information is applied to control terminals 18 and 26, the circuit also responds logarithmically to produce a current related input voltage. Such digital signal processing is disclosed in U.S. Pat. No. 4,001,603 by Milton E. Wilcox. The patent is titled EMITTER LOAD SWITCHING CIRCUIT, is assigned to the assignee of the present invention and its teaching is incorporated herein by reference. Transistors 52 and 53 operating as a unit will develop a voltage related to the current flowing in them as will transistors 54 and 55. These transistors will develop a $\Delta V_{BE}$ which is related to the differential currents as follows:

$$\Delta V_{BE} = V_T l_n \frac{I52 + I53}{I54 + I55}$$

where: $V_T$ is the thermal voltage and the currents are those of the indicated transistors. It can be seen that $\Delta V_{BE}$ will be log related to the current ratio and is applied as a differential input to transistors 16–17 and 24–25. This sort of response has benefit in digital input signal processing as set forth in the Wilcox patent.

It is to be understood that, while the input circuit in FIG. 2 is shown only at the main control input, an identical input control circuit can, if desired, be coupled between terminals 46 and 47 and the bases of transistors 44 and 45.

EXAMPLE

The circuit of FIG. 1 was fabricated using conventional monolithic epitaxial silicon PN junction isolation construction parts. Capacitor 28 was fabricated on chip by employing a pair of square metal plates 195 microns on a side separated by an oxide 0.78-microns thick. The nominal capacitance was close to 1.86 picofarads. Resistors 14 and 15 were each 274.5 ohms and resistors 22 and 23 were each 100 ohms. All other resistors had a value of about 2000 ohms which made $I_1$ equal to about 0.3 microamperes at 300° K. The NPN transistors were operated at a current density of about 80 microamperes per square micron. The circuit was operated with a 5 volt power supply and the operation was compatible with standard ECL specifications. The free running VCO operated at 125.3 MHz and could easily be pulled to exactly 125 MHz. The modulation sensitivity of terminals 18 and 26 was measured at 0.327 MHz per millivolt of differential signal. At terminals 47 and 46 the differential sensitivity was 0.152 MHz per millivolt. The VCO has a lock range of about 6.4 MHz and a capture range of about 0.3 MHz.

The invention has been described and an example detailed. When a person skilled in the art reads the foregoing description, alternatives and equivalents, within the spirit and intent of the invention, will be apparent. For example, additional modulation ports could be added if desired. Accordingly, it is intended that the scope of the invention be limited only by the claims that follow.

We claim:

1. In an emitter coupled multivibrator circuit comprising a pair of differentially operated transistors, a capacitor coupled between the emitters of said pair of transistors, load means coupled between the collectors of said pair of transistors and a first power supply reference terminal, a pair of current sources coupled between said emitters of said pair of transistors and a second power supply terminal, a pair of emitter followers cross-coupled between the collectors and bases of said pair of transistors to provide oscillatory feedback therebetween, and a first modulation port for controlling the conduction of said current sources for varying the frequency of oscillation of said pair of transistors, the improvement comprising:
   a first differential amplifier having differential input terminals coupled to the bases of said pair of transistors, differential outputs coupled to the collectors of said pair of transistors and a third constant current source coupled to pass the tail current in said first differential amplifier to said second power supply terminal; and
   means responsive to the voltage of said first port for modulating said tail current in said differential amplifier differentially with respect to the currents in said pair of current sources.

2. The improvement of claim 1 further comprising a second modulation port with means for modulating said current in said differential amplifier as a function of the voltage at said second port.

3. The improvement of claim 2 wherein each of said modulation ports include means for responding to differential inputs.

4. The improvement of claim 2 wherein all three of said constant current sources are commonly coupled to said second power supply terminal through a fourth constant current source.

5. The improvement of claim 3 wherein said second modulation port comprises a second differential amplifier having a pair of input terminals comprising said second port input, an output coupled to the juncture of said third current source and the tail current connection of said first differential amplifier and a tail current supply coupled to said second power supply terminal.

6. The improvement of claim 3 wherein said means for responding to differential inputs further includes means for responding logarithmically to the input voltage whereby nonlinear response to a digital input is achieved.

* * * * *